United States Patent [19]

Palara

[11] Patent Number: 5,557,139
[45] Date of Patent: Sep. 17, 1996

[54] BURIED BASE VERTICAL BIPOLAR POWER TRANSISTOR WITH IMPROVED CURRENT GAIN AND OPERATION AREA

[75] Inventor: Sergio Palara, Acitrezza, Italy

[73] Assignee: Consorzio per la Ricerca Sulla Microelettronica nel Mezzogiorno, Catania, Italy

[21] Appl. No.: 267,315

[22] Filed: Jun. 28, 1994

[30] Foreign Application Priority Data

Jul. 1, 1993 [EP] European Pat. Off. ............... 93830287

[51] Int. Cl.⁶ ............................ H01L 29/72; H01L 29/90; H01L 27/02
[52] U.S. Cl. ............................ 257/592; 257/582; 257/580; 257/549; 257/548; 257/550; 257/513; 257/539; 257/577
[58] Field of Search ............................ 257/592, 591, 257/577–584, 539, 542, 543, 513, 517, 548–550, 564, 565

[56] References Cited

U.S. PATENT DOCUMENTS

| | | | |
|---|---|---|---|
| 4,130,826 | 12/1978 | Bachle et al. | 257/591 |
| 4,506,280 | 3/1985 | Merrill . | |
| 4,652,895 | 3/1987 | Roskos | 257/577 |
| 4,933,739 | 6/1990 | Harari | 257/577 |
| 5,274,267 | 12/1993 | Moksvold | 257/592 |
| 5,408,124 | 4/1995 | Palara | 257/591 |

FOREIGN PATENT DOCUMENTS

| | | | |
|---|---|---|---|
| 0322040 | 6/1989 | European Pat. Off. | H01L 21/82 |
| 0532481 | 3/1993 | European Pat. Off. | 257/577 |
| 0544364 | 6/1993 | European Pat. Off. | H01L 29/73 |
| 0083361 | 5/1985 | Japan | 257/577 |
| 0314866 | 12/1988 | Japan | 257/592 |
| 0094557 | 4/1990 | Japan | 257/577 |

*Primary Examiner*—Rolf Hille
*Assistant Examiner*—Alexander Oscar Williams
*Attorney, Agent, or Firm*—David M. Driscoll; James H. Morris

[57] ABSTRACT

The transistor comprises a buried base P region, a buried emitter N+ region with elongate portions (fingers), deep contact P+ base regions, emitter N+ interconnection regions serving balancing resistor functions, and base, emitter, and collector surface contact electrodes. To provide a higher current gain and a larger safe operation area, with each emitter "finger" there are associated a screening P region interposed between the "finger" and a part of the respective N+ interconnection region, and a contact N+ region which extends to the "finger" and is surface connected to the screening P region by a dedicated electrode.

15 Claims, 2 Drawing Sheets

BURIED BASE VERTICAL BIPOLAR POWER TRANSISTOR WITH IMPROVED CURRENT GAIN AND OPERATION AREA

BACKGROUND OF THE INVENTION

1. FIELD OF THE INVENTION

This invention relates to monolithic integrated semiconductor devices, and in particular to a vertical bipolar power transistor with buried base and interdigitated geometry.

2. DESCRIPTION OF THE PRIOR ART

A bipolar transistor of this type is described in Italian Patent Application MI91A/03159 filed by the Applicant on 26.11.91. This is manufactured using a process known as VIPower (a trademark of SGS-THOMSON MICROELECTRONICS s.r.l.) and described in European Patent Application EP-322040 by SGS-THOMSON MICROELECTRONICS s.r.l., which is specially conceived to provide integrated structures including power devices and signal processing circuitry for controlling the power devices. Shown in FIG. 1 of the accompanying drawings is a sectional view of a portion of an integrated structure described in the above Italian Patent Application. The integrated structure 50 is a chip of semiconductor material of the N type.

The structure manufacturing process can be summarized as follows. Formed by epitaxial growth on a substrate 10 of monocrystalline silicon, as heavily doped with impurities of the N type, is a first layer 11 having the same type of N conductivity but a lower concentration of impurities. Note that the concentrations of N-type and P-type impurities are customarily denoted by adding the sign "+" or the sign "−" to the characters N and P; the characters N and P with no "+" or "−" sign added denote concentrations of medium value. Formed by implantation on the surface of the epitaxial layer 11 are P-type regions having a comparatively low impurity concentration, followed by N-type regions having high impurity concentrations and being implanted over said P-type regions. A second layer 12 of the N type having a higher concentration of impurities than the first layer 11 is then formed over the layer 11 by epitaxial growth. During this step, which is carried out at a high temperature, the implanted regions of the P type and the N type spread through the two epitaxial layers to produce buried regions, as respectively indicated at 13 and 14 in the drawings, which form together a junction and are to provide the base region and emitter region, respectively, of the bipolar power transistor.

Formed then in the second epitaxial layer 12, using conventional masking and diffusion techniques, are regions of the P type which have high concentrations of impurities, indicated at 15, through-penetrating the second epitaxial layer 12 to join the region 13 and constitute the deep contact base regions of the transistor.

Using similar techniques, regions 17 of the N type are subsequently formed which have high impurity concentrations and extend as far as the respective buried emitter regions to provide deep emitter contacts and regions 16 of the N type, also at high concentrations, which constitute, together with their respective regions 17, interconnection regions between the emitter regions and the front surface of the chip. Such interconnection regions 16 and 17 have resistivities and sizes adequate to provide emitter ballast resistors.

Subsequently, on the front surface of the chip which is coated with a layer of silicon dioxide indicated at 9, metallic strips 18 and 19 are formed using conventional deposition, masking, and etching techniques, which strips are in contact with respective surface areas of the regions 15 and 16 to form the transistor base and emitter electrodes, respectively, and are led to base B and emitter E termination areas of the transistor, respectively. On the chip bottom, i.e. on the exposed surface of the substrate 10, there is formed a metallic layer 28 which constitutes the collector terminal C of the transistor.

The above-described structure shows in plan view a so-called interdigitated construction, i.e. one formed by an emitter region which extends into a comb-like pattern—or pattern having elongate portions being the regions 14 in FIG. 1—within the base region 13. An interconnection region, consisting of a deep emitter contact portion 17 and an expanded surface portion 16, extends across each of the elongate portions 14, and deep contact base regions 15 extend between adjacent elongate portions 14. The single strips which form the emitter and base electrodes are interleaved like crossed fingers of two hands, whence the expression "interdigitated geometry".

The prior art transistor just described has an emitter with a very high perimeter-to-area ratio, and when the emitter resistances are properly dimensioned, an even current distribution to the various "fingers" of the emitter. Briefly stated, it can operate on large currents while having small bulk. However, it has been found that when operated at a high voltage and a large current, the prior transistor is beset with limitations that should not appear according to theory.

Specifically, the safe operating area (SOA) of the transistor is found smaller than estimated, and the current gain during operation at high collector current levels is less than could be anticipated of a transistor provided with the above-described structure.

SUMMARY OF THE INVENTION

It is the object of this invention to provide a vertical bipolar power transistor with a buried base and interdigitated construction, having a similarly buried emitter region, and at least one elongate portion connected to a surface emitter electrode through an interconnection region of predetermined resistivity, which transistor has none of the drawbacks besetting the prior art transistor, namely exhibits a higher current gain and a larger safe operation area, with all the other conditions being equal.

This object is achieved by that this transistor comprises, for each elongate emitter portion, a horizontal isolation or screening region having an opposite type of conductivity from that of the emitter region which is interposed between the emitter interconnection region and the respective elongate portion all around the perimeter of the latter, a contact region having the same type of conductivity as the interconnection region and which extends from the front surface to the elongate portion all around the perimeter of the latter, and electrically conductive means of surface contact which connect the screening region and the contact region to each other.

BRIEF DESCRIPTION OF THE DRAWINGS

The invention can be better understood by having reference to the following detailed description of an exemplary, and in no way limitative, embodiment thereof, to be read in conjunction with the accompanying drawings, in which.

DETAILED DESCRIPTION OF THE PREFERRED EMBODIMENTS

The constructional features of this invention stem from some hypotheses made by the inventor to find the origin of the conventional transistor problems. Such hypotheses will be first discussed hereinafter, followed by the constructional features and arguments directed to explain the effect of such features and substantiate the hypotheses.

Figure 1:
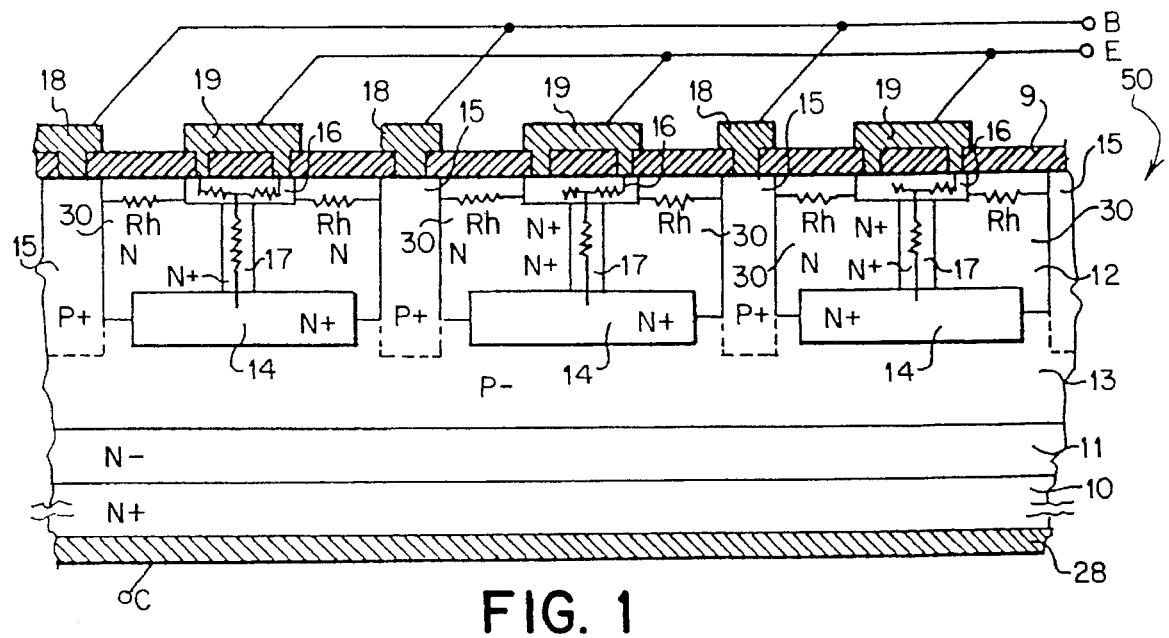
FIG. 1, previously described, shows schematically a partial section through a conventional bipolar vertical transistor structure.
Figure 2:
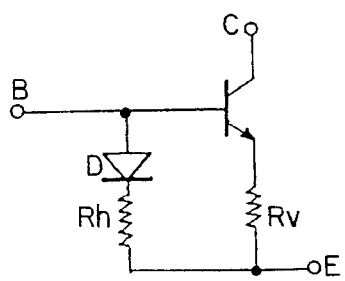
FIG. 2 is an equivalent circuit diagram of the transistor structure shown in FIG. 1.

In the equivalent circuit of FIG. 2, the conventional transistor of FIG. 1 is shown combined with an emitter balancing resistor Rv formed by the ballast resistances of the deep contact N+ regions 17 and surface connection regions 16, and with two parasitic components in series with each other between the base terminal B and the emitter terminal E. Such parasitic components comprise a diode D, formed by the junctions between the base contact P+ regions 15 and the areas N adjacent thereto, denoted by 30, of the epitaxial layer 12, and a resistor Rh which represents the ballast resistance from the material which locates between said junctions and the regions 16, 17 in the areas 30.

An analysis of this simple circuit shows that, when a positive voltage is applied between the base B and the emitter E of the transistor to put it into conduction, the diode D is also forward biased, whereby some of the current supplied to the base terminal B is lost through the diode D and cannot contribute to the transistor current gain. This adverse effect is the more apparent the larger becomes the emitter current of the transistor, because the voltage drop across the resistor Rv increases with the emitter current, and accordingly, the voltage between the terminal B and the terminal E also increases. This voltage increase between B and E results in the shunt current through the diode D being increased, which lowers the current gain of the transistor, expressed as the ratio of the collector current to the current supply to the terminal B.

As to the transistor strength, that is the spread of the transistor safe operation area as defined in the plane having the collector-emitter voltage on the abscissa axis and the collector current on the ordinate axis, as the locus of those points where the transistor can operate safely, it is determined by the uniformity of the emitter current through the emitter "fingers" of the transistor. The ballast resistance of the interconnection regions 16 and 17 forming the emitter balancing resistor Rv, as described in the aforementioned Italian Application, is indeed effective to evenly distribute the emitter current all around the perimeter of the emitter region. In actual practice, however, the emitter current components from the emitter "fingers" 14 would not be fully conveyed through the N+ regions 17 and 16 to the contact strips 19, but partly flowed through the areas 30 of the epitaxial layer 12, which have the same type of conductivity but a higher resistivity.

Figure 4:
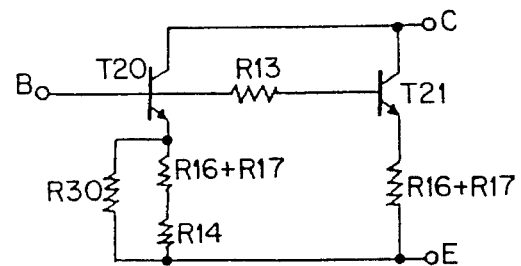
FIG. 4 is an equivalent circuit diagram illustrating the transistor operation as to the part shown in FIG. 3.
Figure 3:
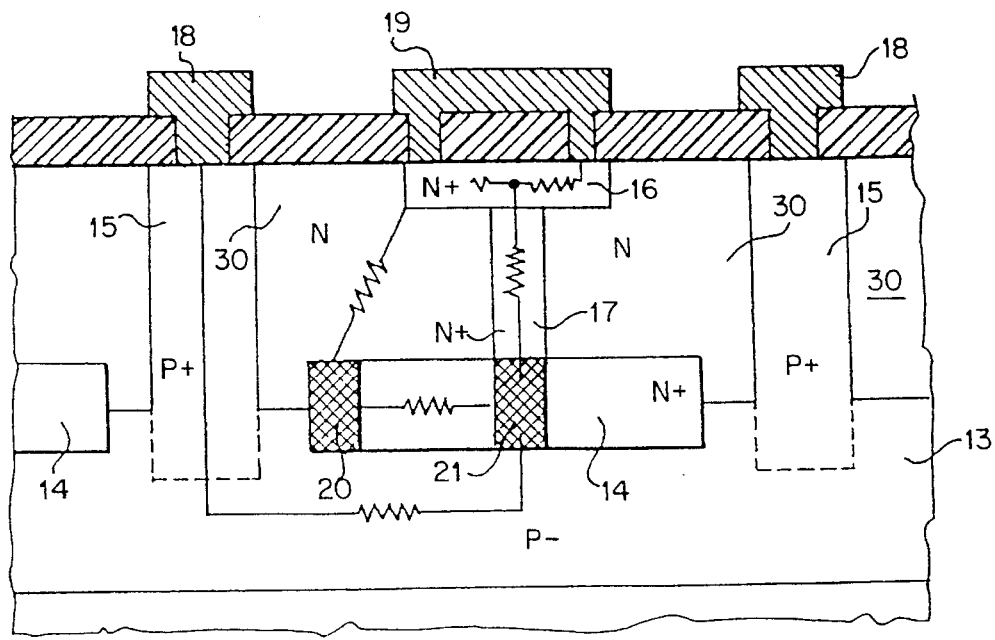
FIG. 3 is an enlarged detail view of FIG. 1.

This situation can be readily visualized by considering, as depicted in FIG. 3, two portions 20 and 21 of an emitter "finger" 14 which form, in combination with corresponding portions of the base region 13 and collector region 11, two elementary transistors T20, T21 connected to each other. The equivalent wiring diagram of the structure comprised of the transistors T20 and T21 is shown in FIG. 4, wherein transistor T21 has ballast resistance R16+R17 due to the interconnection regions 16 and 17, as its balancing resistor, and transistor T20 has as its balancing resistor the ballast resistance R16+R17+R14, due both to the interconnection regions 16, 17 and the section of the emitter region 14 between the portions 20, 21, in parallel with the ballast resistance R30 of the region 30. This means that a large proportion of the current from the emitter portion 20 will be bypassed through the resistive layer 30 of the epitaxial region. Notice that the paths of the base currents of the two transistors T20 and T21 are different, a situation which can be represented by a resistor R13 between the bases of said transistors and results in the transistor T21 bias becoming lower than that of transistor T20. In essence, T20 conducts more current than T21, so that at large currents, current will be focused between the portion 20 and the emitter contact E through the resistor R30. This reflects in lowered effectiveness of the ballast resistances, which adversely affects the strength of the power transistor as a whole.

Figure 5:
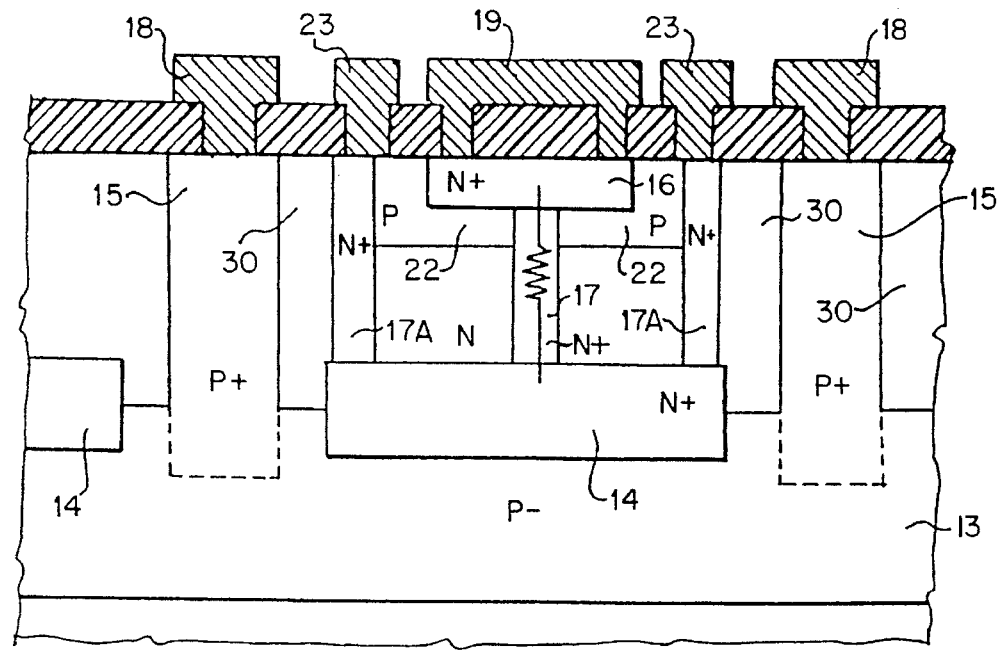
FIG. 5 shows schematically a partial section through a vertical bipolar transistor structure according to the invention.

Shown in FIG. 5 is an embodiment of a transistor according to this invention which is similar in construction to the conventional transistor provided by the method described in the aforementioned European Application. As can be seen, associated with each emitter "finger" are two N+ regions 17A, which are quite similar to the deep emitter contact regions 17, and two P regions denoted by 22 which contain most of the expanded connection portions 16 and are bounded laterally by the regions 17 and 17A. Two surface contact metallic strips 23 join together the P regions 22 and the N+ regions 17A at the surface. The regions 22, regions 17A, and contact strips 23 extend, in plan view, all around the perimeter of each emitter "finger".

Figure 6:
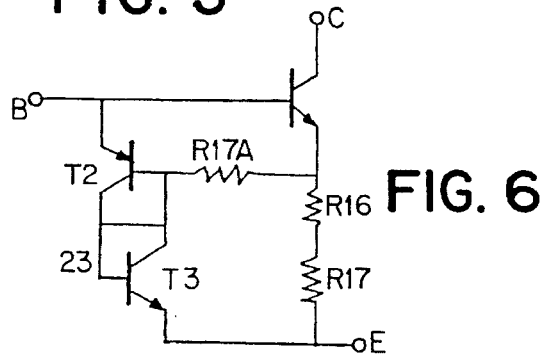
FIG. 6 is an equivalent circuit diagram of the transistor structure shown in FIG. 5.

The equivalent circuit diagram of the inventive power transistor is shown in FIG. 6. As can be gathered from the structure shown in FIG. 5, provided between the base B and the emitter E terminals of the power transistor instead of the serially connected diode D (FIG. 2) and resistor R of the conventional structure, are two transistors, both connected in a diode configuration. Specifically, one transistor is a PNP type, indicated at T2 in the diagram, having the deep base contact 15 as its emitter region, and as its base region, the region 30 formed by the epitaxial layer 12 and the N+contact region 17A, with the screening region 22 forming its collector region, it further having its base and collector terminals shorted through the surface contact metal strip 23. The other transistor, indicated at T3, is an NPN type and has, as its emitter region, the expanded portion 16 of the emitter connection region, the screening region 22 as its base region, and the N+ contact region 17A as its collector region, and also has the base and collector terminals shorted through the surface contact metal strip 23. The contact region 17A forms a ballast resistor, shown at R17A in the diagram of FIG. 6, connecting the metal strip 23 to the emitter region of the power transistor. The resistors R16 and R17 represent the balancing ballast resistors formed by the interconnection regions 16 and 17.

From a comparison of the prior art diagram in FIG. 2 with that of FIG. 6 illustrating the inventive transistor, it can be seen that, in the instance of FIG. 6, the current loss from the base terminal B of the power transistor is no longer there, unless the voltage between the base terminal B and the emitter terminal is higher than or equal to the sum of the forward bias voltages $2V_{BE}$ of the emitter-base junction of the PNP transistor T2 and the base-emitter junction of the NPN transistor T3. In view of that between the base B and emitter E terminals there is the base-emitter junction of the power transistor having a comparable forward bias voltage $V_{BE}$ to that of the junctions of T2 and T3, in order to satisfy this condition, it will suffice that the ballast resistors R16 and R17 be sized to have the voltage drop across these serial resistors due to the emitter current of the power transistor made smaller than a junction forward bias voltage $V_{BE}$ which would typically be of 0.6–0.7 Volts, as is well known. Since the balancing effect sought is obtained in practice through very small emitter resistances causing voltages drops which are typically in the 0.1 V range, the above condition can be readily satisfied. The fact that no current losses occur from the base terminal B reflects in increased current gain of the power transistor.

Additionally to providing improved current gain, with the above-described structure, the ballast resistances are more effective because the loss of emitter current from the emitter region through the epitaxial layer 12, as represented by resistor R30 in the diagram of FIG. 4, is now prevented by the screening action of the P region 22. This action exists on condition that the base-emitter junction of transistor T3 was not forward biased. It can be seen from the foregoing considerations that this would not take place if the ballast resistances R6 and R7 are suitable sizes. This ultimately causes the current to be better distributed through the various fingers, thereby preventing the current from being focused in limited regions and making the whole power transistor stronger than the prior art transistor.

It matters to observe that the transistor of this invention may be formed into an integrated device by the VIPower method with no additional steps to the standard VIPower method. In fact, the P-type screening regions 22 may be formed simultaneously with the base regions of the vertical bipolar transistors of the control circuit portion of the integrated device, and the N+ contact regions may be formed simultaneously with the deep contact emitter regions 17. Understandably, the surface contact metallic strips 23 may also be formed simultaneously with the other metal electrodes provided on the front surface of the chip.

Figure 7:
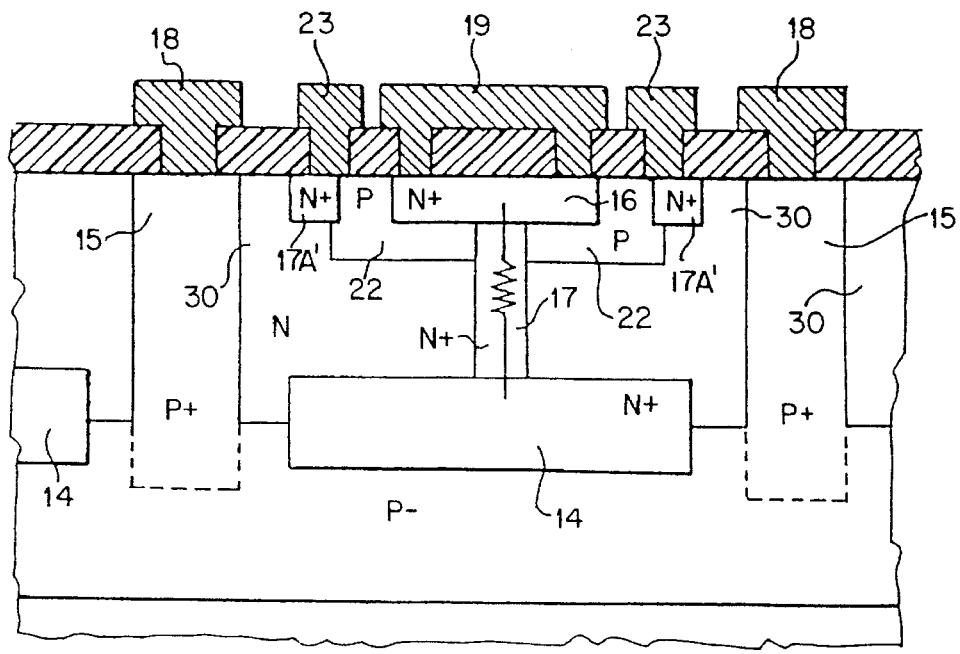
FIG. 7 shows schematically a partial section through a vertical bipolar transistor structure according to a variant of this invention.

In a variant of the invention shown in FIG. 7, the additional region of the N+ type, indicated there at 17A', does not extend as far as the emitter region 14, and is formed simultaneously with the region 16. The equivalent diagram of the resultant structure is again that of FIG. 6, with the single difference that in this case, instead of the resistor R17A, a higher value resistor would be provided by the serial ballast resistance of the region 17A' and the underlying area included in the epitaxial region 12 of increased resistivity.

While one embodiment and one variant of the invention have been described and illustrated, it may be appreciated that many changes may be made thereunto within the same inventive concept. For instance, each emitter "finger" could contain more than one elongate portion 14 with respective interconnection regions 16, 17, the surface connection electrodes could be made of an electrically conductive material other than a metal, such as doped polycrystalline silicon, etc. In addition, complementary structures of that described may be provided using materials and regions of the type instead of those of the N type, and vice versa.

What I claim is:

1. A vertical bipolar power transistor formed with an interdigitated geometry on a chip of a semiconductor material of the N type, comprising:

a base region of the P type in a buried layer within the N type material;

an N+ emitter region in a buried layer forming a junction with the base region and having at least one elongate portion;

at least one P+ deep contact base region which extends from a first surface of the chip to the base region;

at least one N+ interconnection region extending from the first surface of the chip to a respective one of the at least one elongate portion of the N+ emitter region, and having resistivity and size selected to form an emitter balancing ballast resistor;

first means for providing electrical contact between the at least one P+ deep contact base region and a base terminal of the transistor;

second means for providing electrical contact between the at least one N+ interconnection region and an emitter terminal of the transistor;

third means for providing electrical contact between a second surface of the chip remotely disposed from the first surface and a collector terminal of the transistor;

at least one P type screening region corresponding to a respective one of the at least one elongate portion and a respective one of the at least one N+ interconnection region, and extending from the first surface towards its respective elongate portion and being adjacent to an upper part of its respective N+ interconnection region;

at least one N+ contact region corresponding to a respective one of the at least one elongate portion and a respective one of the at least one P type screening region, the at least one N+ contact region extending from the first surface towards the respective one of the at least one elongate portion, and being adjacent to the respective one of the at least one P type screening region; and fourth means for providing electrical contact between each P type screening region and its respective N+ contact region.

2. A transistor according to claim 1, wherein the at least one N+ contact region contacts its respective elongate portion of the N+ emitter region.

3. A transistor according to claim 1, wherein the at least one N+ interconnection region has an expanded surface portion.

4. A transistor according to claim 1, wherein the size and resistivity of the at least one N+ interconnection region is selected such that the voltage drop across the emitter balancing ballast resistor will not exceed the voltage drop across a forward biased junction, at a largest emitter current of the transistor.

5. A transistor according to claim 1, wherein regions of the P type are provided instead of the N-type regions, and regions of the N type are provided instead of the P-type regions.

6. A transistor according to claim 1, wherein the first means and the second means contact the first surface of the chip, and wherein the third means contacts the second surface of the chip.

7. A transistor according to claim 1, wherein the at least one N+ contact region is separated from its respective at least one elongate portion by its respective at least one P type screening region and the N type material.

8. A vertical bipolar power transistor, comprising:

a base layer of a first conductivity type, the base layer having an inner surface and an outer surface;

an epitaxial layer of a second conductivity type, the epitaxial layer having an inner surface and an outer surface, the inner surface of the base layer contacting the inner surface of the epitaxial layer;

at least one deep contact region of the first conductivity type, the at least one deep contact region contacting the outer surface of the epitaxial layer and the base layer;

at least one emitter region of the second conductivity type, the at least one emitter region contacting the base layer and the outer surface of the epitaxial layer;

at least one contact region of the second conductivity type, the at least one contact region corresponding to a respective one of the at least one emitter region, and contacting the outer surface of the epitaxial layer; and at least one screening region of the first conductivity type, the at least one screening region corresponding to a respective one of the at least one emitter region and a respective one of the at least one contact region, and contacting the respective one of the at least one emitter region, the respective at least one contact region, and the outer surface of the epitaxial layer.

9. The transistor of claim 8, wherein the at least one contact region contacts its respective one of the at least one emitter region.

10. The transistor of claim 8, wherein the at least one contact region is separated from its respective at least one emitter region by its respective at least one screening region and the epitaxial layer.

11. The transistor of claim 8, further comprising:

a collector layer of the second conductivity type, the collector layer having an inner surface contacting the outer surface of the base layer and an outer surface such that the at least one screening region and the at least one contact region are separated from the collector layer by the at least one emitter region and the base layer.

12. The transistor of claim 8, wherein the at least one emitter region includes:

a buried portion contacting the base layer and the epitaxial layer; and a connecting portion contacting the buried portion and the outer surface of the epitaxial layer.

13. The transistor of claim 12, wherein the buried portion of the at least one emitter region is elongated in a direction parallel to the base layer, and wherein the connecting portion includes:

a surface portion contacting the outer surface of the epitaxial layer, the surface portion being elongated in the direction parallel to the base layer; and a interconnection portion that interconnects the surface portion to the buried portion.

14. The transistor of claim 13, wherein the interconnection portion is elongated in a direction perpendicular to the direction parallel to the base layer.

15. The transistor of claim 8, wherein the at least one emitter region is constructed and arranged to provide a resistivity such that a voltage drop across the at least one emitter region does not exceed a voltage drop across a forward biased emitter/base junction at the largest emitter current of the transistor.

* * * * *